United States Patent
Tsai et al.

(10) Patent No.: US 12,525,596 B2
(45) Date of Patent: Jan. 13, 2026

(54) SEMICONDUCTOR DEVICE AND METHOD FOR FABRICATING THE SAME

(71) Applicant: UNITED MICROELECTRONICS CORP., Hsin-Chu (TW)

(72) Inventors: Shih-Hung Tsai, Tainan (TW); Chien-Ting Lin, Tainan (TW); Yu-Hsiang Lin, New Taipei (TW); Ssu-I Fu, Kaohsiung (TW); Chih-Kai Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 384 days.

(21) Appl. No.: 17/673,749

(22) Filed: Feb. 16, 2022

(65) Prior Publication Data

US 2023/0215855 A1    Jul. 6, 2023

(30) Foreign Application Priority Data

Dec. 30, 2021   (CN) .......................... 202111649991.2

(51) Int. Cl.
*H01L 25/18*    (2023.01)
*H01L 23/00*    (2006.01)
*H01L 25/00*    (2006.01)
*H01L 25/065*   (2023.01)

(52) U.S. Cl.
CPC .......... *H01L 25/18* (2013.01); *H01L 25/0657* (2013.01); *H01L 25/50* (2013.01); *H01L 24/08* (2013.01); *H01L 24/32* (2013.01); *H01L 2224/08145* (2013.01); *H01L 2224/08146* (2013.01); *H01L 2224/32145* (2013.01); *H01L 2225/06548* (2013.01); *H01L 2225/06565* (2013.01); *H01L 2225/06572* (2013.01)

(58) Field of Classification Search
None
See application file for complete search history.

(56) References Cited

U.S. PATENT DOCUMENTS

| | | | | |
|---|---|---|---|---|
| 7,884,776 | B2 * | 2/2011 | Mohamadi | H01Q 3/26 343/853 |
| 7,955,887 | B2 * | 6/2011 | Assefa | H01L 27/0688 438/455 |
| 8,889,487 | B2 * | 11/2014 | Mallikarjunaswamy | H01L 21/8234 257/E21.705 |
| 8,921,901 | B1 | 12/2014 | Kao | |
| 9,565,383 | B2 * | 2/2017 | Sukegawa | H01L 25/167 |
| 9,691,725 | B2 * | 6/2017 | Chang | H01L 24/92 |
| 10,056,353 | B2 * | 8/2018 | Tsai | H01L 25/0657 |
| 10,157,951 | B2 * | 12/2018 | Kim | H01L 24/80 |
| 10,163,798 | B1 * | 12/2018 | Alur | H01L 25/18 |

(Continued)

*Primary Examiner* — Telly D Green
(74) *Attorney, Agent, or Firm* — Winston Hsu

(57) ABSTRACT

A method for fabricating semiconductor device includes the steps of first providing a first substrate having a high-voltage (HV) region and a medium voltage (MV) region and a second substrate having a low-voltage (LV) region and a static random access memory (SRAM) region, in which the HV region includes a HV device, the MV region includes a MV device, the LV region includes a fin field-effect transistor (FinFET), and the SRAM region includes a SRAM device. Next, a bonding process is conducted by using hybrid bonding, through-silicon interposer (TSI) or redistribution layer (RDL) for bonding the first substrate and the second substrate.

5 Claims, 3 Drawing Sheets

(56) References Cited

U.S. PATENT DOCUMENTS

| | | | |
|---|---|---|---|
| 10,170,450 B2 * | 1/2019 | Beyne | H01L 24/83 |
| 10,170,512 B2 | 1/2019 | Chen et al. | |
| 11,024,615 B2 * | 6/2021 | Go | H01L 24/24 |
| 11,302,680 B2 * | 4/2022 | Go | H01L 24/13 |
| 11,675,500 B2 * | 6/2023 | Kim | G06F 3/0631 |
| | | | 711/118 |
| 12,073,082 B2 * | 8/2024 | Kim | G06F 3/0611 |
| 2006/0099753 A1 * | 5/2006 | Chen | H01L 21/823857 |
| | | | 257/E21.639 |
| 2016/0181428 A1 * | 6/2016 | Chen | H01L 29/7856 |
| | | | 257/288 |
| 2017/0154873 A1 * | 6/2017 | Kim | H01L 24/73 |
| 2018/0145143 A1 * | 5/2018 | Chen | H01L 29/7851 |
| 2018/0151522 A1 * | 5/2018 | Yang | H01L 24/43 |
| 2018/0240797 A1 * | 8/2018 | Yokoyama | H10B 61/22 |
| 2019/0096682 A1 * | 3/2019 | Kelly | H01L 21/28185 |
| 2019/0296081 A1 * | 9/2019 | Sharma | H10D 30/6756 |
| 2020/0294978 A1 * | 9/2020 | Go | H01L 24/24 |
| 2021/0247910 A1 * | 8/2021 | Kim | G06F 3/0611 |
| 2021/0272940 A1 * | 9/2021 | Go | H01L 21/76898 |
| 2022/0399263 A1 * | 12/2022 | Marin | H01L 23/5384 |
| 2023/0259283 A1 * | 8/2023 | Kim | H01L 25/18 |
| | | | 711/118 |
| 2024/0345736 A1 * | 10/2024 | Kim | G11C 7/1006 |

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method for fabricating display driver integrated circuit (IC).

2. Description of the Prior Art

Semiconductor devices could be applied in various fields such as display driver IC, power management IC, discrete power devices, sensing devices, fingerprint recognition IC, and memories. Semiconductor devices are typically fabricated by first depositing insulating or dielectric layers, conductive layers, and semiconductor material layers onto a semiconductor substrate or silicon wafer and then using photo-etching process to pattern each of the materials for forming circuit components and devices.

Typically, elements such as high-voltage (HV) devices, low-voltage (LV) devices, and static random access memories (SRAMs) within a display driver IC are all disposed on a same silicon wafer or silicon substrate and this design not only increases complexity of fabrication process but also increases overall cost. Hence, how to improve the current fabrication for resolving current problem has become an important task in this field.

SUMMARY OF THE INVENTION

According to an embodiment of the present invention, a method for fabricating semiconductor device includes the steps of first providing a first substrate having a high-voltage (HV) region and a medium voltage (MV) region and a second substrate having a low-voltage (LV) region and a static random access memory (SRAM) region, in which the HV region includes a HV device, the MV region includes a MV device, the LV region includes a fin field-effect transistor (FinFET), and the SRAM region includes a SRAM device. Next, a bonding process is conducted by using hybrid bonding, through-silicon interposer (TSI) or redistribution layer (RDL) for bonding the first substrate and the second substrate.

According to another aspect of the present invention, a semiconductor device includes a first substrate having a high-voltage (HV) region and a medium-voltage (MV) region and a second substrate disposed on a back surface of the first substrate. Preferably, the second substrate includes a low-voltage (LV) region and a static random access memory (SRAM) region.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
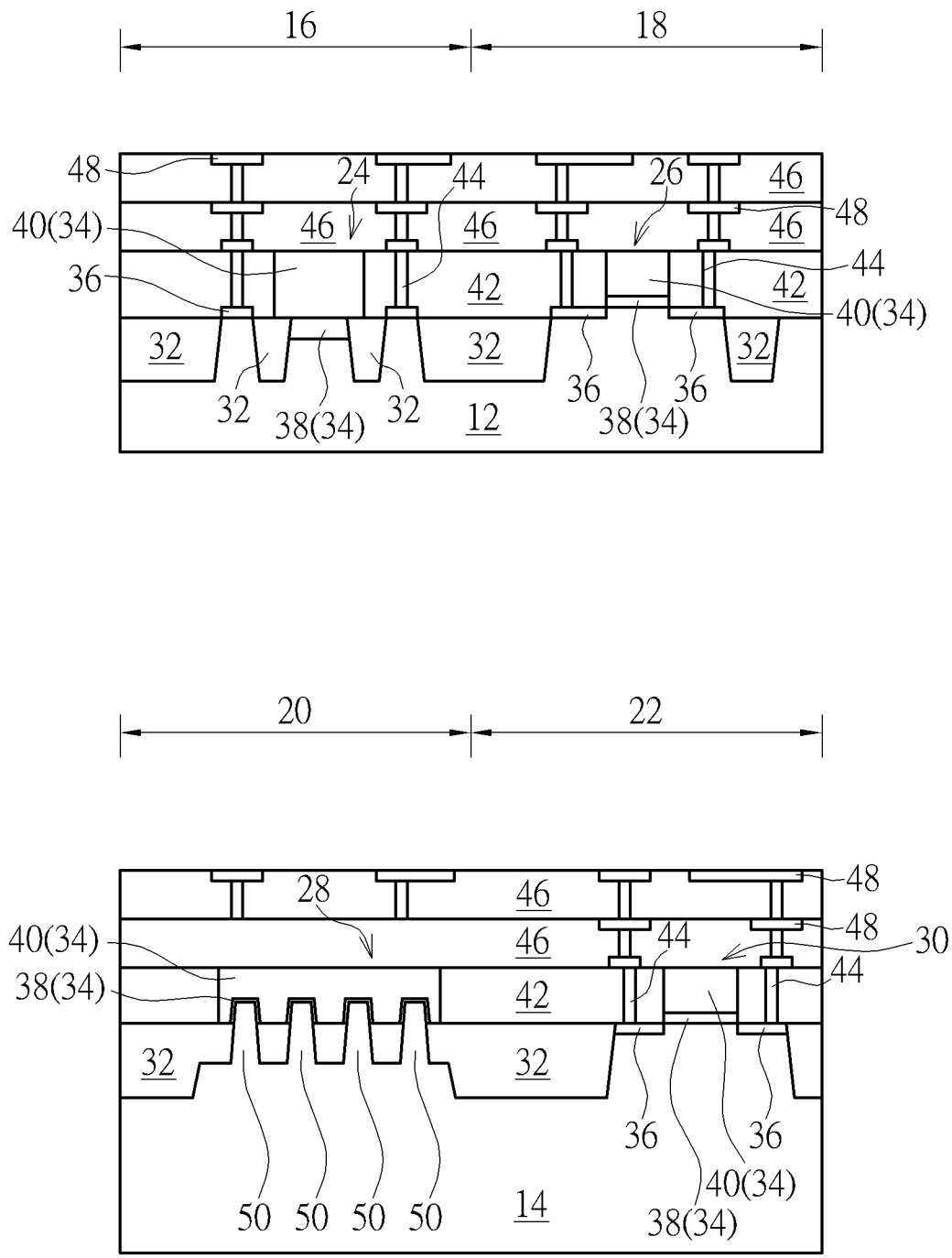
FIGS. 1-2 illustrate a method for fabricating a semiconductor device according to an embodiment of the present invention.
Figure 2:
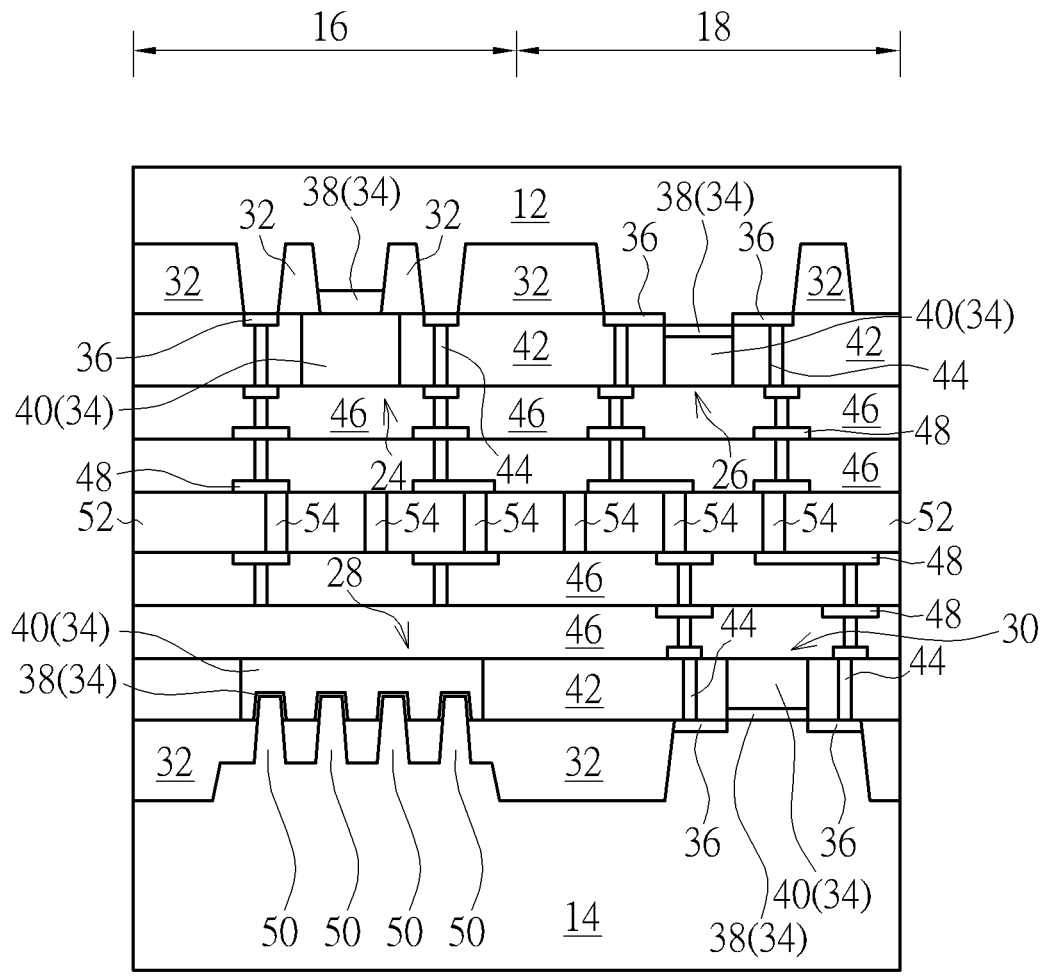

Referring to FIGS. 1-2, FIGS. 1-2 illustrate a method for fabricating a semiconductor device or more specifically a display driver chip according to an embodiment of the present invention. As shown in FIG. 1, two semiconductor substrates such as a first substrate 12 and a second substrate 14 each made of semiconductor material including but not limited to for example silicon, germanium, silicon-germanium compounds, silicon carbide, or gallium arsenide are provided. In this embodiment, each of the first substrate 12 and the second substrate 14 includes an non-diced silicon wafer and devices regions including a HV region, a MV region, a LV region, and a SRAM region are defined on the first substrate 12 and the second substrate 14. For instance, a HV region 16 and a MV region 18 are defined on the first substrate 12 and a LV region 20 and a SRAM region 22 are defined on the second substrate 14. Preferably, one or a plurality of HV devices 24 are disposed on the HV region 16, one or a plurality of MV deices 26 are disposed on the MV region 16, one or a plurality of LV devices 28 are disposed on the LV region 20, and one or a plurality of SRAM devices 30 are disposed on the SRAM region 22, and a shallow trench isolation (STI) 32 is disposed in the first substrate 12 and second substrate 14 for separating each of the aforementioned regions.

In this embodiment, each of the HV devices 24 on the HV region 16 and MV devices 26 on the MV region 18 could include a planar metal-oxide semiconductor (MOS) transistor, in which the MOS transistor could further include a gate structure 34 disposed on the first substrate 12, a spacer (not shown) and a source/'drain region 36 disposed in the first substrate 12 adjacent to two sides of the gate structure 34, and selective epitaxial layer and/or silicides disposed on the surface of the source/drain region 36.

Viewing from a more detailed perspective, each of the gate structures 34 could include a gate dielectric layer 38 and a gate electrode 40, in which the gate dielectric layer 38 preferably includes silicon oxide and the gate electrode 40 could include polysilicon or metal. It should be noted that even though the gate structures 34 include gate electrodes 40 made of polysilicon in this embodiment, according to other embodiments of the present invention it would also be desirable to conduct a replacement metal gate (RMG) process to transform the polysilicon gate structures 34 into metal gates including work function metal layers, which is also within the scope of the present invention. Since the approach of using the RMG process to transform polysilicon gates into metal gates are well known to those skilled in the art, the details of which are not explained herein for the sake of brevity.

Preferably, the spacer could be a single spacer or a composite spacer. For instance, the spacer could further include an offset spacer (not shown) and a main spacer (not shown) and the spacer could be selected from the group consisting of $SiO_2$, SiN, SiON, and SiCN. The source/drain region 36 and epitaxial layer could include different dopants or different material depending on the type of transistor being fabricated. For instance, the source/drain region 36 could include p-type or n-type dopants and the epitaxial layer could include SiGe, SiC, or SiP.

An interlayer dielectric (ILD) layer 42 could be disposed on the first substrate 12 to cover the HV devices 24 and MV devices 26 and a plurality of contact plugs 44 could be formed in the ILD layer 42 to electrically connect the source/drain regions 36. Next, a metal interconnective process is conducted to form a plurality of inter-metal dielectric (IMD) layers 46 and metal interconnections 48 in the IMD layer 46 to electrically connect the contact plugs 44. In this embodiment, each of the contact plugs 44 and/or metal interconnections 48 could be embedded in the ILD layer 42 and/or IMD layers 46 according to a single damascene process or dual damascene process. Preferably, each of the contact plugs 44 and/or metal interconnections 48 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since the fabrication of planar or non-planar transistor and metal interconnect structures is well known to those skilled in the art, the details of which are not explained herein for the sake of brevity.

In contrast to the HV devices 24 and MV devices 26 on the first substrate 12 are made of planar MOS transistors, each of the LV devices 28 on the LV region 20 preferably includes a fin field effect transistor (FinFET), in which the FinFET could include a plurality of fin-shaped structures 50 disposed on the second substrate 14, a gate structure 34 disposed on the fin-shaped structures 50, a spacer (not shown) and a source/'drain region 36 disposed in the second substrate 14 adjacent to two sides of the gate structure 34, and selective epitaxial layer and/or silicides disposed on the surface of the source/drain region 36.

Each of the SRAM devices 30 on the SRAM region 22 could include a planar metal-oxide semiconductor (MOS) transistor, in which the MOS transistor could further include a gate structure 34 disposed on the second substrate 14, a spacer (not shown) and a source/'drain region 36 disposed in the second substrate 14 adjacent to two sides of the gate structure 34, and selective epitaxial layer and/or silicides disposed on the surface of the source/drain region 36.

According to an embodiment of the present invention, the fin-shaped structures 50 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 50 could also be obtained by first forming a patterned mask (not shown) on the second substrate, 14, and through an etching process, the pattern of the patterned mask is transferred to the second substrate 14 to form the fin-shaped structures 50. Moreover, the formation of the fin-shaped structures 50 could also be accomplished by first forming a patterned hard mask (not shown) on the second substrate 14, and a semiconductor layer composed of silicon germanium is grown from the second substrate 14 through exposed patterned hard mask via selective epitaxial growth process to form the corresponding fin-shaped structure. These approaches for forming fin-shaped structures are all within the scope of the present invention.

Similar to the gate structures on the first substrate 12, each of the gate structures 34 on the LV region 20 and SRAM region 22 could include a gate dielectric layer 38 and a gate electrode 40, in which the gate dielectric layer 38 preferably includes silicon oxide and the gate electrode 40 could include polysilicon or metal. It should be noted that even though the gate structures 34 include gate electrodes 40 made of polysilicon in this embodiment, according to other embodiments of the present invention it would also be desirable to conduct a replacement metal gate (RMG) process to transform the polysilicon gate structures 34 into metal gates including work function metal layers, which is also within the scope of the present invention. Since the approach of using the RMG process to transform polysilicon gates into metal gates are well known to those skilled in the art, the details of which are not explained herein for the sake of brevity.

Moreover, an interlayer dielectric (ILD) layer 42 could be disposed on the second substrate 14 to cover the LV devices 28 and SRAM devices 30 and a plurality of contact plugs 44 could be formed in the ILD layer 42 to electrically connect the source/drain regions 36. Next, a metal interconnective process is conducted to form a plurality of inter-metal dielectric (IMD) layers 46 and metal interconnections 48 in the IMD layer 46 for electrically connecting the contact plugs 44. In this embodiment, each of the contact plugs 44 and/or metal interconnections 48 could be embedded in the ILD layer 42 and/or IMD layers 46 according to a single damascene process or dual damascene process. Preferably, each of the contact plugs 44 and/or metal interconnections 48 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since the fabrication of planar or non-planar transistor and metal interconnect structures is well known to those skilled in the art, the details of which are not explained herein for the sake of brevity.

Next, as shown in FIG. 2, a bonding process is conducted to connect the first substrate 12 and the second substrate 14. In this embodiment, the bonding process could be accomplished by disposing a through-silicon interposer (TSI) 52 made of semiconductor material between the first substrate 12 and the second substrate 14 and then forming a plurality of through-silicon vias (TSVs) 54 in the TSI 52 to connect the first substrate 12 and the second substrate 14. In this embodiment, each of the TSVs 54 could further include a barrier layer and a metal layer, in which the barrier layer could include Ta, TaN, Ti, TiN, or combination thereof and the metal layer could include Cu. It should be noted that even though the TSI 52 is connecting the front side of the first substrate 12 and the front side of the second substrate 14 through the TSVs 54 in this embodiment, according to other embodiment of the present invention, it would also be desirable to connect or directly contact the back side of the first substrate 12 and the front side of the second substrate 14, connect the back side of the first substrate 12 and the back side of the second substrate 14, and/or form extra TSVs in addition to the TSVs 54 for connecting the two substrates 12, 14 or silicon wafers, which are all within the scope of the present invention.

According to yet another embodiment of the present invention, it would also be desirable to conduct a photo-etching process to remove part of the TSVs 54 for forming a patterned conductive pattern or redistribution layer (RDL) connecting the first substrate 12 and the second substrate 14. For instance, it would be desirable to first form one or more through-silicon via holes in the TSI 52, form a patterned mask such as patterned resist on the TSI 52 as the patterned mask includes a plurality of openings corresponding to the pattern of RDL, and then fill the through-silicon via holes with conductive material such as a patter layer and metal layer and conduct a planarizing process to form a RDL for connecting the first substrate 12 and the second substrate 14.

Figure 3:
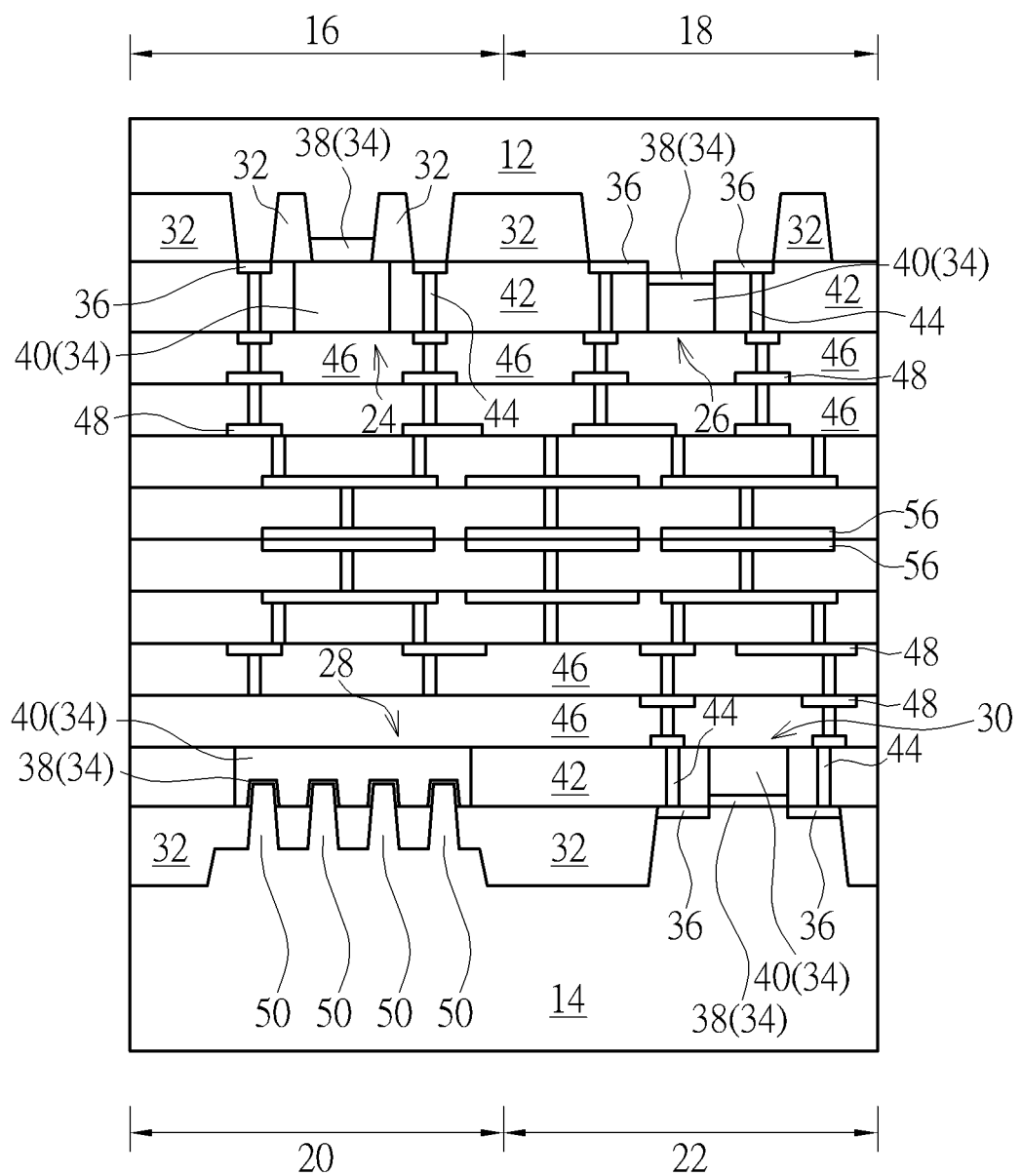
FIG. 3 illustrates a structural view of a semiconductor device according to an embodiment of the present invention.

Referring to FIG. 3, FIG. 3 illustrates a structural view of a semiconductor device according to an embodiment of the present invention. As shown in FIG. 3, in addition to the aforementioned approach of using TSI to connect the first substrate 12 and second substrate 14, it would also be desirable to use a hybrid bonding approach for connecting the first substrate 12 and second substrate 14. For instance, after back-end-of-line (BEOL) process is completed on the first substrate 12 and the second substrate 14, metal conductors such as conductive vias or bonding pads are formed to connect the metal interconnections 48 disposed in the IMD layer 46 on first substrate 12 and second substrate 14 with substrates or silicon wafers facing front side to front side. Similar to the formation of the aforementioned metal interconnections 48, the metal conductors 56 disposed between the first substrate 12 and second substrate 14 could be fabricated in the upper level dielectric layers above the IMD layers 46 through a single damascene process or dual damascene process. Preferably, each of the metal conductors 56 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP).

Overall, in contrast to the current approach of fabricating a display driver chip by disposing all of HV devices, MV devices, LV devices, and SRAM devices of a display driver IC on the same silicon wafer, the present invention preferably forms the HV devices, MV devices, LV devices, and SRAM devices fabricated from different process or technology nodes on different silicon wafers separately. For instance, the HV devices and MV devices fabricated through 28 nm process node are formed on the first substrate or first silicon wafer and the LV devices and SRAM devices fabricated through 14 nm process node are formed on the second substrate or second silicon wafer. Next, a TSI or hybrid bonding process could be employed for bonding the first substrate and second substrate according to the process disclosed in the aforementioned embodiments.

Preferably, the HV devices and MV devices disposed on the first substrate together constitute elements including multiplexers, digital to analog converters (DACs), amplifiers, gamut mapping algorithms (GMA), and open sound control (OSC) elements of a display driver chip. The LV devices and SRAM devices disposed on the second substrate on the other hand constitute bandgap reference (BGR) and mobile industry processor interface (MIPI) devices. By disposing the HV devices and MV devices fabricated through 28 nm process node on the first substrate and disposing LV devices and SRAM devices fabricated through 14 nm process node on the second substrate, the present invention not only simplifies the complexity for fabricating display driver ICs but also minimizes waste of space usage on silicon wafers and lowers overall fabrication cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first substrate having a high-voltage (HV) region and a medium-voltage (MV) region;
   a HV device on the HV region and a MV device on the MV region, wherein the HV device and the MV device are fabricated through a first process node;
   a first inter-metal dielectric (IMD) layer on the HV region and the MV region;
   a first metal interconnection in the first IMD layer of the HV region and connected to the HV device;
   a second metal interconnection in the first IMD layer of the MV region and connected to the MV device;
   a second substrate disposed on a back surface of the first substrate, wherein the second substrate comprises a low-voltage (LV) region and a static random access memory (SRAM) region;
   a LV device on the LV region and a SRAM device on the SRAM region, wherein the LV device and the SRAM device are fabricated through a second process node and the first process node and the second process node are different;
   a second IMD layer on the LV region and the SRAM region;
   a third metal interconnection in the second ID layer of the LV region and on the LV device;
   a fourth metal interconnection in the second IMD layer of the SRAM region and connected to the SRAM device;
   a through-silicon interposer (TSI) between a back end of the first substrate and a front end or a back end of the second substrate;
   a first through-silicon via (TSV) in the TSI and in direct contact with the first metal interconnection and the third metal interconnection; and
   a second TSV in the TSI and in direct contact with the second metal interconnection and the fourth metal interconnection.

2. The semiconductor device of claim 1, wherein the LV region comprises a fin field-effect transistor (FinFET).

3. The semiconductor device of claim 1, further comprising a redistribution layer (RDL) between the first substrate and the second substrate.

4. The semiconductor device of claim 1, wherein the first substrate comprises a silicon wafer.

5. The semiconductor device of claim 1, wherein the second substrate comprises a silicon wafer.

\* \* \* \* \*